(12) United States Patent
Horii

(10) Patent No.: US 12,656,241 B2
(45) Date of Patent: Jun. 16, 2026

(54) TERMINAL BLOCK UNIT, AND MONITORING SYSTEM USING THE SAME

(71) Applicant: Laplace System Co., Ltd., Kyoto (JP)

(72) Inventor: Masayuki Horii, Kyoto (JP)

(73) Assignee: LAPLACE SYSTEM CO., LTD., Kyoto (JP)

( * ) Notice: Subject to any disclaimer, the term of this patent is extended or adjusted under 35 U.S.C. 154(b) by 360 days.

(21) Appl. No.: 18/260,450

(22) PCT Filed: Nov. 12, 2021

(86) PCT No.: PCT/JP2021/041722
§ 371 (c)(1),
(2) Date: Jan. 3, 2024

(87) PCT Pub. No.: WO2022/149348
PCT Pub. Date: Jul. 14, 2022

(65) Prior Publication Data
US 2025/0327734 A1 Oct. 23, 2025

(30) Foreign Application Priority Data
Jan. 6, 2021 (JP) ................................ 2021-001106

(51) Int. Cl.
*G01N 17/02* (2006.01)
*G01N 1/28* (2006.01)
(Continued)

(52) U.S. Cl.
CPC .............. *G01N 17/02* (2013.01); *G01N 1/28* (2013.01); *G01N 27/026* (2013.01);
(Continued)

(58) Field of Classification Search
CPC ........ G01N 17/02; G01N 1/28; G01N 27/026; G01N 27/221; G01N 2011/0066;
(Continued)

(56) References Cited

U.S. PATENT DOCUMENTS 9,966,714 B1 5/2018 Sreedharan et al.
2006/0054004 A1* 3/2006 Funaki ................. G10H 1/0058
84/600
(Continued)

FOREIGN PATENT DOCUMENTS

JP S57184014 U 11/1982
JP 2006309727 A 11/2006
(Continued)

OTHER PUBLICATIONS

ISA Japan Patent Office, International Search Report Issued in Application No. PCT/JP2021/041722, Dec. 14, 2021, WIPO, 3 pages.
(Continued)

*Primary Examiner* — Raul J Rios Russo
(74) *Attorney, Agent, or Firm* — McCoy Russell LLP

(57) ABSTRACT

[Problem] To provide a terminal block unit that reduces wiring work and wiring mistakes, lessens installation work, and is capable of flexibly providing necessary functions, and that furthermore has excellent expansion capabilities and can flexibly provide necessary functions even if the number of contacts increases. [Solution] A terminal block unit 10 that is the minimum unit for constructing a measurement system using a sensor or a control system for a monitoring and/or control device using the measurement system, the terminal block unit 10 being used interposed between a sensor or control device connected downstream of the terminal block unit 10 and host devices 28, 30 connected upstream of the terminal block unit 10, the terminal block unit 10 including a plurality of contact terminals 12 and being electrically connected to the sensor or control device through the contact terminals 12, and the terminal block unit 10 being configured such that it is possible to provide direct connection between terminal block units 10 and between the
(Continued)

terminal block unit 10 and the host devices 28, 30 via a common bus.

9 Claims, 12 Drawing Sheets

(51) Int. Cl.
| | |
|---|---|
| *G01N 11/00* | (2006.01) |
| *G01N 27/02* | (2006.01) |
| *G01N 27/22* | (2006.01) |
| *G01R 27/26* | (2006.01) |
| *G01R 31/12* | (2020.01) |

(52) U.S. Cl.
CPC ........... *G01N 27/221* (2013.01); *G01R 27/26* (2013.01); *G01R 27/2617* (2013.01); *G01R 31/12* (2013.01); *G01N 2011/0066* (2013.01); *G01N 2011/0073* (2013.01); *G01N 2011/008* (2013.01); *G01N 2011/0086* (2013.01); *G01N 2011/0093* (2013.01)

(58) Field of Classification Search
CPC ..... G01N 2011/0073; G01N 2011/008; G01N 2011/0086; G01N 2011/0093; G01R 27/26; G01R 27/2617; G01R 31/12
USPC ........................................ 324/71.1
See application file for complete search history.

(56) References Cited

U.S. PATENT DOCUMENTS

| | | | |
|---|---|---|---|
| 2007/0186367 A1 | 8/2007 | Field et al. | |
| 2011/0075923 A1* | 3/2011 | Imai ..................... | H04N 1/6033 |
| | | | 382/167 |
| 2013/0254447 A1 | 9/2013 | Molnar et al. | |
| 2015/0088277 A1* | 3/2015 | Perrault .................. | B29C 45/26 |
| | | | 700/28 |
| 2015/0244107 A1 | 8/2015 | Lostoski et al. | |
| 2016/0381822 A1* | 12/2016 | Hausler .................. | G01D 11/24 |
| | | | 361/752 |
| 2017/0293280 A1* | 10/2017 | Janak ................... | G05B 19/042 |
| 2019/0124291 A1* | 4/2019 | Murakami ........... | H04L 5/0048 |
| 2022/0102100 A1 | 3/2022 | Horii | |

FOREIGN PATENT DOCUMENTS

| | | | |
|---|---|---|---|
| JP | 2009525818 A | 7/2009 | |
| JP | 2013036214 A | 2/2013 | |
| JP | 2015061103 A | 3/2015 | |
| WO | 2020203672 A1 | 10/2020 | |

OTHER PUBLICATIONS

Intellectual Property Office of Vietnam, Office Action Issued in Application No. 1-2023-05185, Dec. 24, 2025, 4 pages.

* cited by examiner

SMART PHONE

PC

PC

4mA          1V

}            }

12mA         3V

}            }

20mA         5V

TERMINAL BLOCK UNIT, AND MONITORING SYSTEM USING THE SAME

CROSS REFERENCE TO RELATED APPLICATIONS

The present application is a U.S. National Phase of International Application No. PCT/JP2021/041722 entitled "TERMINAL BLOCK UNIT AND MONITORING SYSTEM USING SAME," and filed on Nov. 12, 2021. International Application No. PCT/JP2021/041722 claims priority to Japanese Patent Application No. 2021-001106 filed on Jan. 6, 2021. The entire contents of each of the above-listed applications are hereby incorporated by reference for all purposes.

TECHNICAL FIELD

The present invention relates to a novel terminal block unit obtained by combining a data input/output device (a measuring instrument) and a terminal block, and a monitoring system using the terminal block unit.

BACKGROUND ART

In general, in a measurement system, a configuration is adopted in which signal lines connected to many sensors are collected to a "signal input/output apparatus" via a terminal block. The "terminal block" is also used as contact terminals (output ports) for sending control signals to control target apparatuses (hereinafter referred to as "apparatuses to be controlled") based on data acquired from the sensors. That is, many signal lines connected to the sensors and the apparatuses to be controlled are collected to the terminal block provided with the many contact terminals, and the signal lines are connected to the signal input/output apparatus via the terminal block. The signal input/output apparatus has a function of recording data acquired by the sensors, as a measuring instrument (a data logger), and is connected to a small-sized dedicated terminal (a measurement terminal) for recording measurement data and controlling the apparatuses to be controlled, or a calculator (such as a general-purpose computer in which a data processing program is installed) for processing the recorded data, via an input/output interface.

That is, when the general physical connection configuration of a measurement system is simplified, with "sensors or apparatuses to be controlled" as the lower side, and the calculator as the upper side, the configuration can be indicated as:

(a) [sensors or apparatuses to be controlled]-[terminal block]-[signal input/output apparatus]-[measurement terminal]-[calculator]; or (b) [sensors or apparatuses to be controlled]-[terminal block]-[signal input/output apparatus]-[calculator].

FIG. 11A is a diagram (a picture) showing an appearance shape of a conventional signal input/output apparatus 200. As shown in FIG. 11A, the signal input/output apparatus 200 is configured with an apparatus main body 202, a plurality of terminal units 204 each of which has a plurality of contact terminals.

FIG. 11B is a diagram schematically showing a state in which contact terminals of the terminal units 204 of the conventional signal input/output apparatus 200 and contact terminals of a terminal block 300 are electrically connected, respectively, by physical signal lines. Terminals of a terminal unit 204 connected with the signal input/output apparatus 200 and terminals 302a on the upper side of the terminal block 300 are connected in order by electrical wires. The terminals 302a on the upper side of the terminal block 300 are installed, facing terminals 302b on the lower side, and the terminals 302b on the lower side are electrically connected to terminals of sensors or apparatuses to be controlled not shown.

FIG. 12A is a diagram showing an example of an electrical wiring diagram in an electric enclosure. In actual connection work, work of connecting terminals by electrical wires according to such a wiring diagram is required. A label has to be attached to each of signal lines connected to the terminals so that all the signal lines are connected to appropriate terminals. Naturally, as the number of signal lines connected to the terminal block increases, wiring is more complicated.

FIG. 12B is a picture showing a terminal block where a label is attached to each of signal lines connected to terminals.

In the case of conducting an experiment on a small scale in a laboratory or the like, a configuration may be adopted in which "stripped signal lines" are directly connected to a signal input/output apparatus without a terminal block. In the case of assuming continuous operation including maintenance work, however, the configuration in which signal lines are connected to many terminals provided on a terminal block first, and wiring is performed from the terminals of the terminal block to input terminals of a signal input/output apparatus, respectively, is common as described above. As described above, many signal lines are connected to the terminal block and the signal input/output apparatus, and wiring can be very complicated. Since these apparatuses are used being accompanied by equipment, for example, a power source, a breaker, a lightning arrestor (an SPD), and an AC adapter that are required according to a system configuration, a configuration in which wiring is installed in one box-shaped casing called an electric enclosure is common.

FIG. 5B is a diagram (a picture) showing an internal configuration of a 64-point measurement electric enclosure shown as a configuration example, the diagram showing the inside of an electric enclosure configured with a commercially available signal input/output apparatus (R3 Series made by M-System Co., Ltd.) A state is shown in which many wires are physically connected between terminals in an electric enclosure.

CITATION LIST

Patent Literature

Patent Literature 1: International Publication No. WO 2020/203672

SUMMARY OF INVENTION

Technical Problem

Thus, in the conventional configuration, signal lines are stripped in an electric enclosure, and installation work, maintenance work, reconfiguration work accompanying addition and installation of apparatuses, and the like are accompanied by labor at a work site.

Further, since a signal input/output apparatus equipped with general-purpose functions, which can be used for various purposes, is used in the conventional configuration, there may be useless functions that are not used at all, depending on purposes. That is, such over-specifications cause increase in installation, operation, and maintenance costs.

For example, for the purpose of only to monitoring physical quantities (temperature, power generation, and the like) measured by sensors without necessity of control, the required functions of an input/output device are only functions as those of a measuring instrument (a data logger) for recording data acquired by the sensors. Further, the function required for the measuring instrument differs depending on whether data acquired by each sensor is an "analog signal" or a "digital signal". In the case of the acquired data being an analog signal, an A/D converter with minimum specifications required according to each purpose is required. In the case of the acquired data being a digital signal, the digital signal can be entered to a measuring instrument as it is. Furthermore, as the conventional example described above, some conventional signal input/output apparatuses can cope in some extent with the case that the number of contact terminals increases, by installing additional terminal units, but the number of terminal units that can be connected is limited.

The technical subject that the present invention is to provide a terminal block unit capable of reducing wiring work and wiring mistakes in a terminal block to save labor of installation work, flexibly providing necessary functions and, even if the number of contact terminals increases, flexibly providing the necessary functions, with high expandability, and provide a monitoring system using such a terminal block unit.

Solution to Problem

A terminal block unit according to the present invention is terminal block unit to be a minimum unit for constructing a measurement system using a sensor, or a control system for an apparatus to be monitored and/or controlled, using the measurement system, wherein the terminal block unit is used, intervening between the sensor or the apparatus to be controlled, which is connected lower than the terminal block unit, and a host apparatus connected higher than the terminal block unit;

the terminal block unit includes a plurality of contact terminals and is electrically connected to the sensor or the apparatus to be controlled, through any of the contact terminals; and the terminal block unit is configured so that direct connection is possible between the terminal block unit and another terminal block unit and between the terminal block unit and the host apparatus through a common bus.

Here, the host apparatus is a small-sized dedicated terminal (a measurement terminal) for recording measurement data acquired by the sensor and controlling an apparatus to be controlled, or a calculator (such as a general-purpose computer in which a data processing program is installed) for processing the recorded data.

The terminal block unit according to the present invention is configured with at least any one of three types of basic units (Type X, Type Y, and Type Z in embodiments described later), and terminal block units are combined and used according to purposes. However, such expandability is provided that, if another basic configuration is further designed, the basic configuration can be added. The basic units can be combined and used according to purposes.

In the above configuration, the terminal block unit and the other terminal unit may be configured so that power is supplied from the common bus. This is because, even when a plurality of terminal block units are installed in a switchboard, the necessity of separately preparing a power source is eliminated. If the number of connected terminal block units increases, and power is not sufficient only by power supply from the bus, then a configuration is also possible in which power is supplied from the outside by an AC adapter or the like.

In the above configuration, the terminal block unit may be configured to include a plurality of indicators corresponding to the contact terminals, respectively. This is because, since each contact terminal of the terminal block unit has a function of any of a signal input terminal or output terminal, usability is enhanced by being able to visually grasp the state of each contact by an indicator.

In the above configuration, the terminal block unit may be configured to include a connector directly connectable to the other terminal block unit not via wiring. This is because, since wiring is unnecessary, there is an advantage of simplifying installation work and the like.

In the above configuration, the terminal block unit may be configured to include a control circuit for, in response to a non-voltage contact output of the sensor connected lower for the host apparatus connected higher, lighting up an indicator corresponding to an input state, and transmitting an input value as digitized data by communication via the bus, according to control from the measurement device. This is a configuration that is applied to a terminal block unit of a type of inputting an output signal from a sensor as a digital signal (Type X).

In the above configuration, the terminal block unit may be configured to include a function of receiving an output value of the sensor as an analog value of a current or voltage, for the host apparatus connected higher to light up an indicator of color or illuminance corresponding to the received input value, and a control circuit for converting the input value to digitized data according to control from the host apparatus to transmit the data to the host apparatus by communication via the bus. This is a configuration that is applied to a terminal block unit of a type of inputting an output signal from a sensor as an analog signal (Type Y).

In the above configuration, the terminal block unit may be configured to include a control circuit for performing open-drain non-voltage contact output to the apparatus to be controlled, and lighting up an indicator according to a state of the contact output, by control from the host apparatus connected higher through communication via the bus. This is a configuration that is applied to a terminal block unit of a type of outputting a control signal from a host apparatus to an apparatus to be controlled (Type Z).

An electric enclosure according to the present invention is an electric enclosure connecting one or more connected terminal block units and a host apparatus, each of the connected terminal block units and the host apparatus being the terminal block unit and the host apparatus that are described in any of the above paragraphs, wherein the host apparatus is a measurement terminal, the measurement terminal having a function of recording data outputted from the terminal block unit or the terminal block units. It is not necessarily required to be installed in the electric enclosure. By using the terminal block units according to the present invention in the electric enclosure, the necessity of conventional complicated wiring work is eliminated, and an electric enclosure that looks simple is obtained.

A monitoring system according to the present invention is a monitoring system for acquiring states of an electrical circuit provided at a remote place, by a sensor, and collectively displaying the states of the electrical circuit, wherein the sensor, the terminal block unit and the host apparatus that are described above are installed in a monitoring target area; and data collected to the host apparatus is received via a telecommunications line.

Since it is possible to efficiently collect data of each base by using a terminal block unit of the present invention, it becomes possible to easily construct a monitoring system that is applicable to various purposes.

Advantageous Effects of Invention

A terminal block signal input/output apparatus according to the present invention has many advantages such as:

(1) the measurement unit itself is inexpensive;

(2) units other than the measurement unit are unnecessary;

(3) it is not necessary to separately provide a terminal block;

(4) the electric enclosure is compact;

(5) wiring labor costs and cable costs are significant reduced; and (6) cost reduction can be realized by packaging.

Since unnecessary functions are omitted, significant cost reduction is enabled in comparison with a conventional signal input/output apparatus that is often used with over-specifications.

BRIEF DESCRIPTION OF DRAWINGS

FIGS. 1A, 1B, and 1C show a perspective view, a front view, and a rear view, respectively.

Figure 2A:
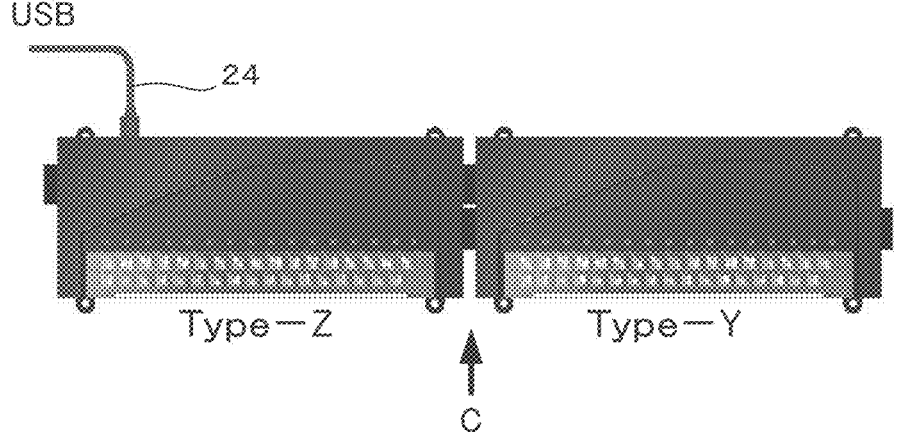
Figure 2B:
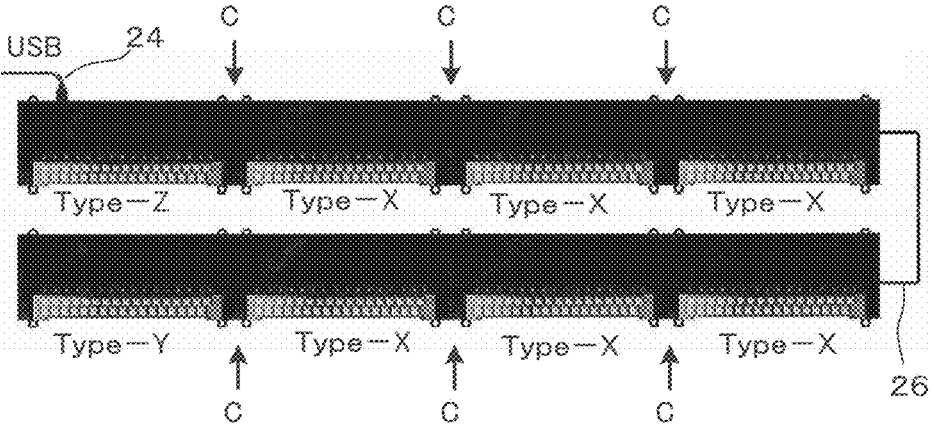

Both of FIGS. 2A and 2B show a state in which a plurality of terminal block units are connected.

Figure 3A:
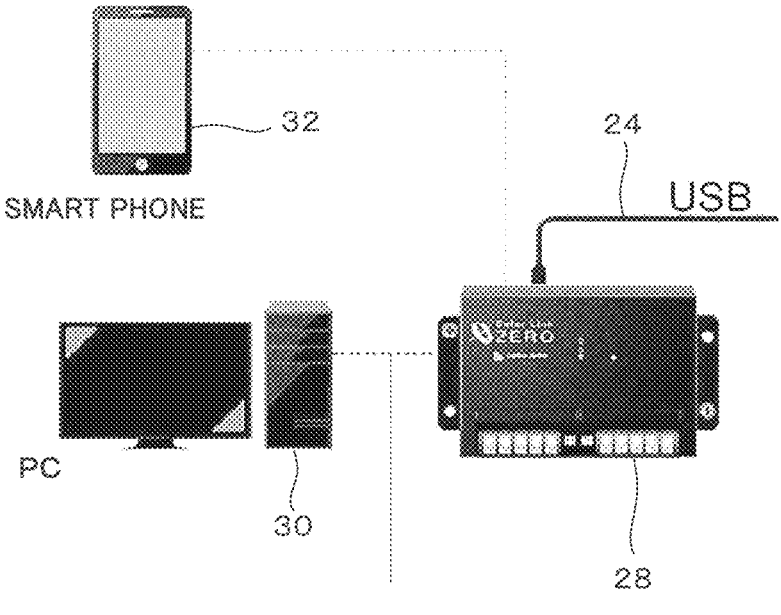
Figure 3B:
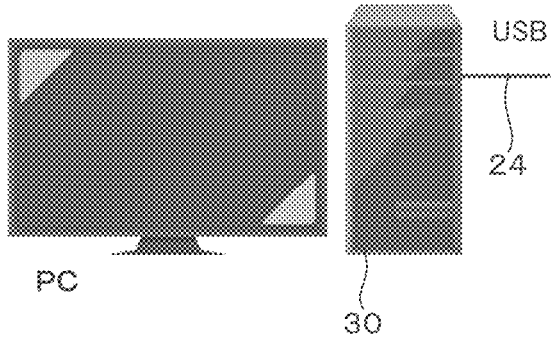

Both of FIGS. 3A and 3B show a state in which a host apparatus is connected to the other end of a bus cable 24 that is connected to a terminal block unit.

Figure 4:
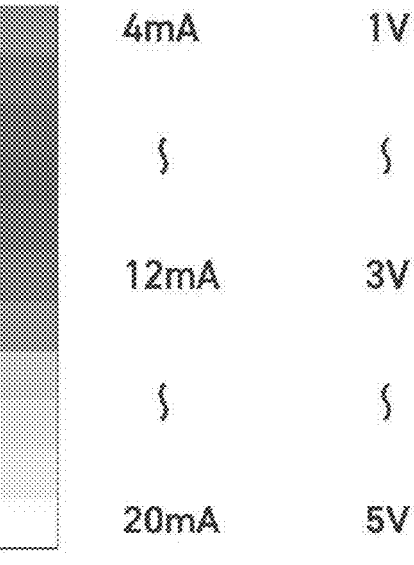

FIG. 4 is a diagram showing change in color of an indicator 20.

Figure 5A:
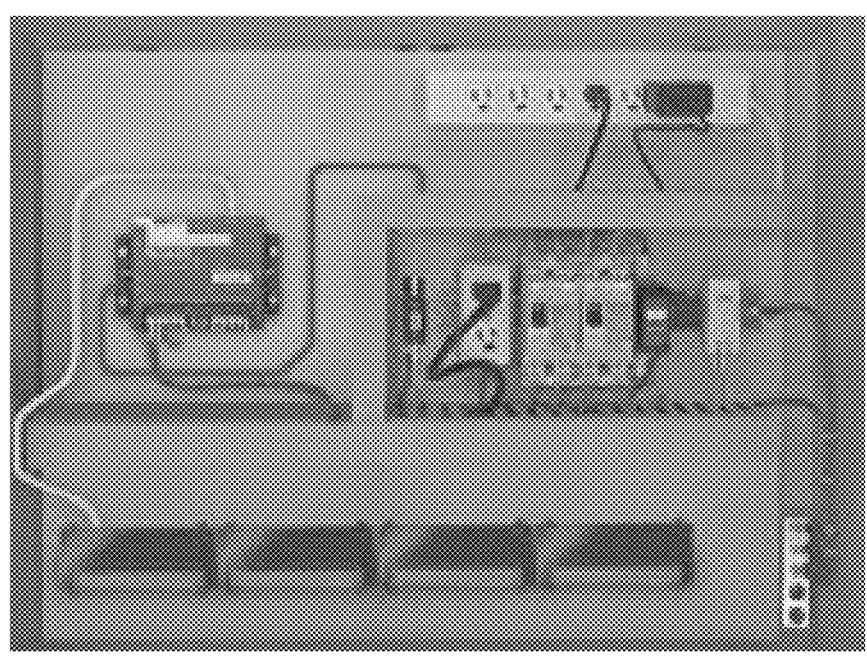

FIG. 5A shows an example of configuring a conventional 64-point measurement switchboard (FIG. 5B) configured with a signal input/output apparatus 200 and a terminal block 300 described with reference to FIG. 11, with a terminal block unit 10 shown in the present embodiment without changing the number of measurement points.

Figure 5B:
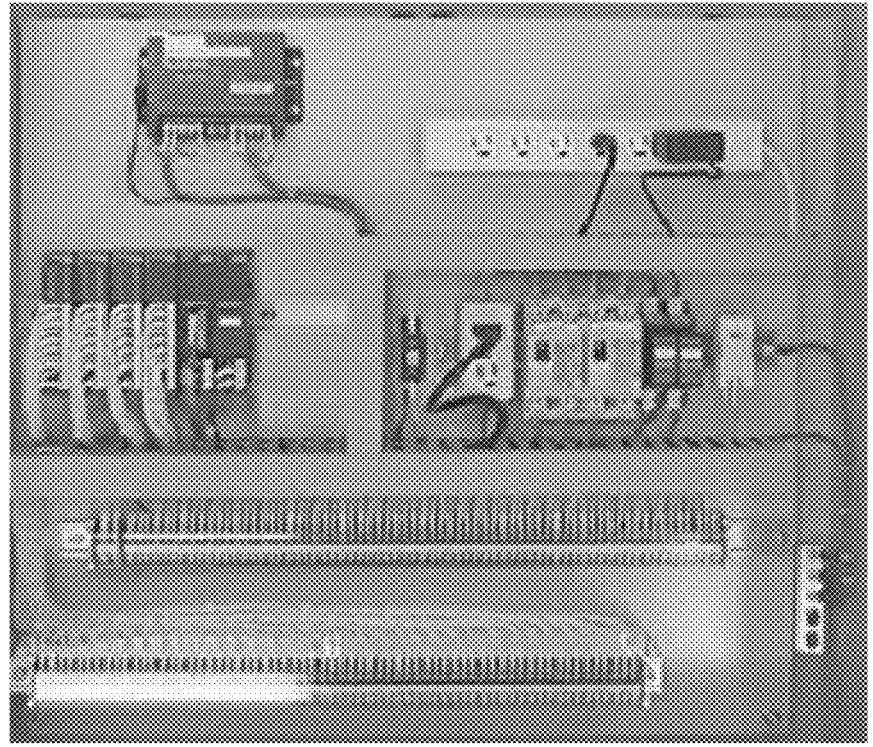

FIG. 5B is a diagram (a picture) showing an internal configuration of a 64-point measurement electric enclosure shown as a configuration example, the diagram showing the inside of an electric enclosure configured with a commercially available signal input/output apparatus (R3 Series made by M-System Co., Ltd.)

Figure 6:
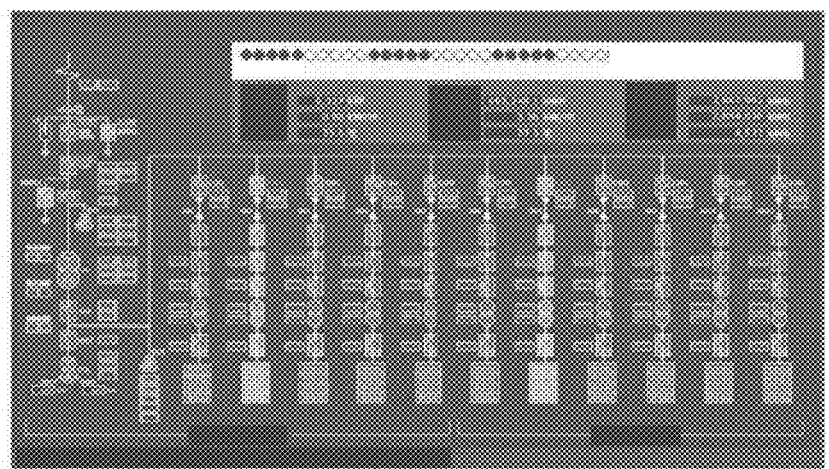

FIG. 6 is a diagram showing a system diagram screen applied to remote monitoring of a photovoltaic power generation system configured with a contact input (Type X) terminal block unit.

Figure 7:
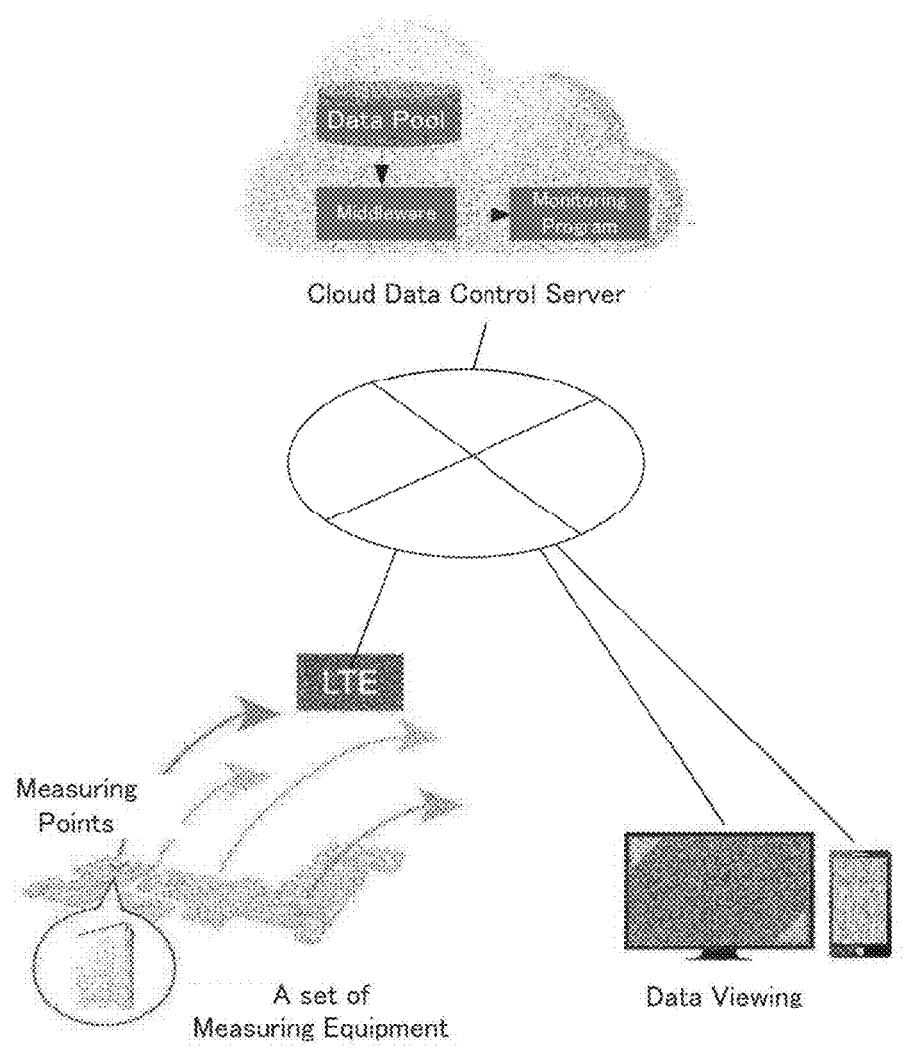

FIG. 7 is a conceptual diagram showing an example of, by arranging a set of measurement equipment provided with a measurement or monitoring/control system constructed using a terminal block unit of the present invention in various places, constructing a system in which necessary data is transmitted to a cloud data management server from each base to enable data viewing from a remote place.

Figure 8:
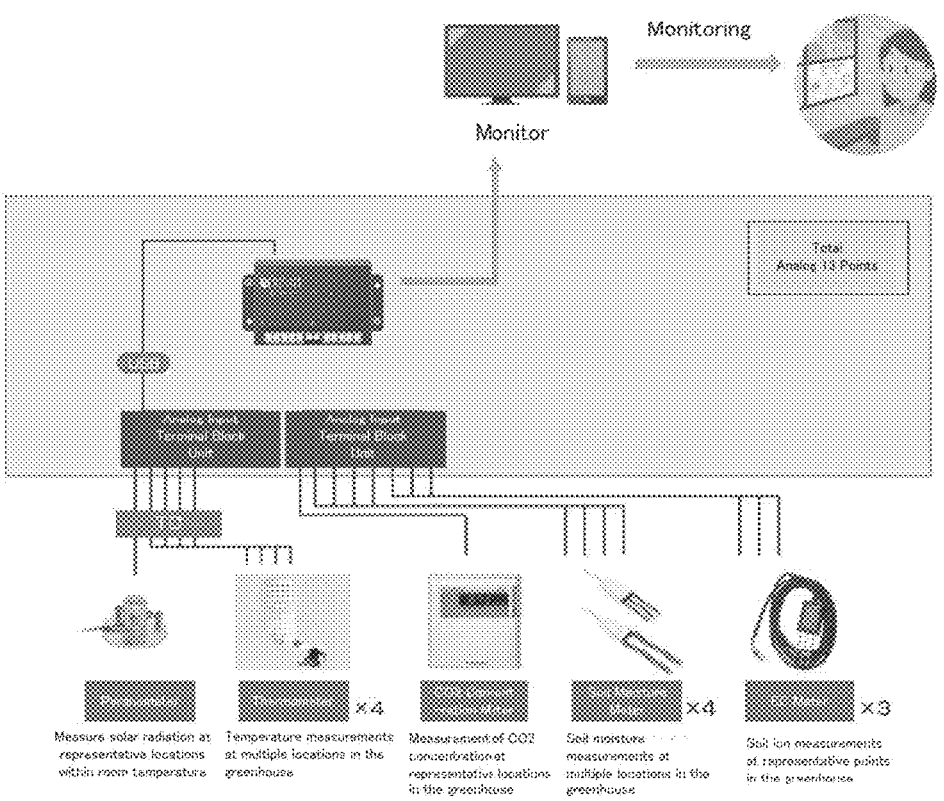

FIG. 8 is a diagram showing an example of applying a monitoring system of the present embodiment to a monitoring system in a vinyl house.

Figure 9A:
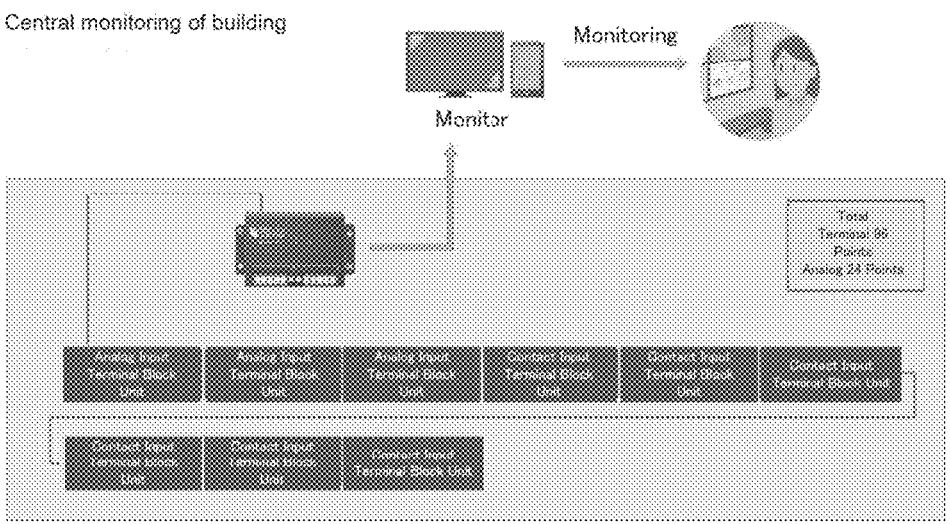
Figure 9B:
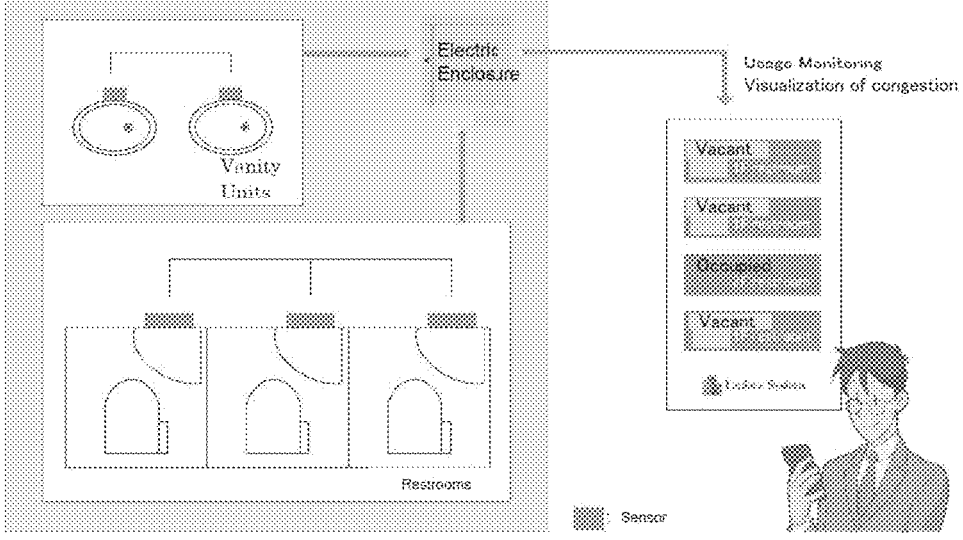

FIG. 9A is a diagram showing an example of applying the monitoring system of the present embodiment to a central monitoring system in a building. FIG. 9B is a diagram showing an example of applying the monitoring system of the present embodiment to a restroom use situation monitoring system.

Figure 10A:
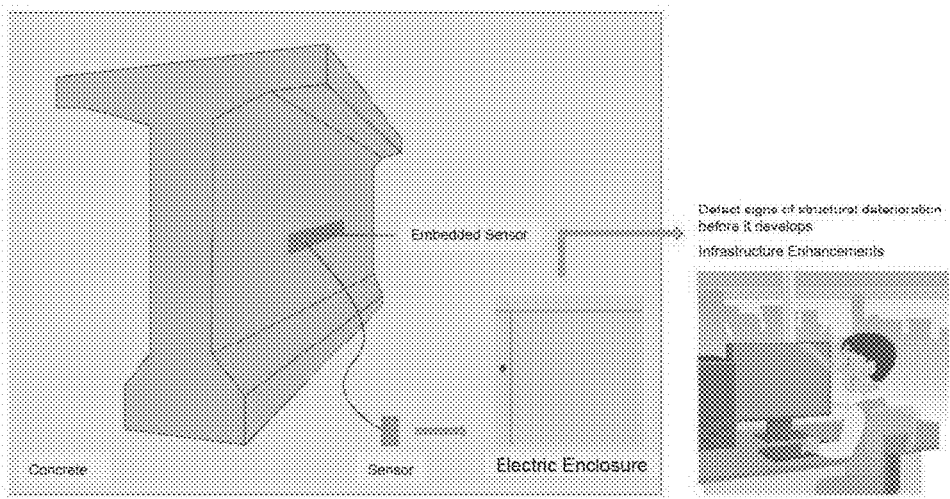
Figure 10B:
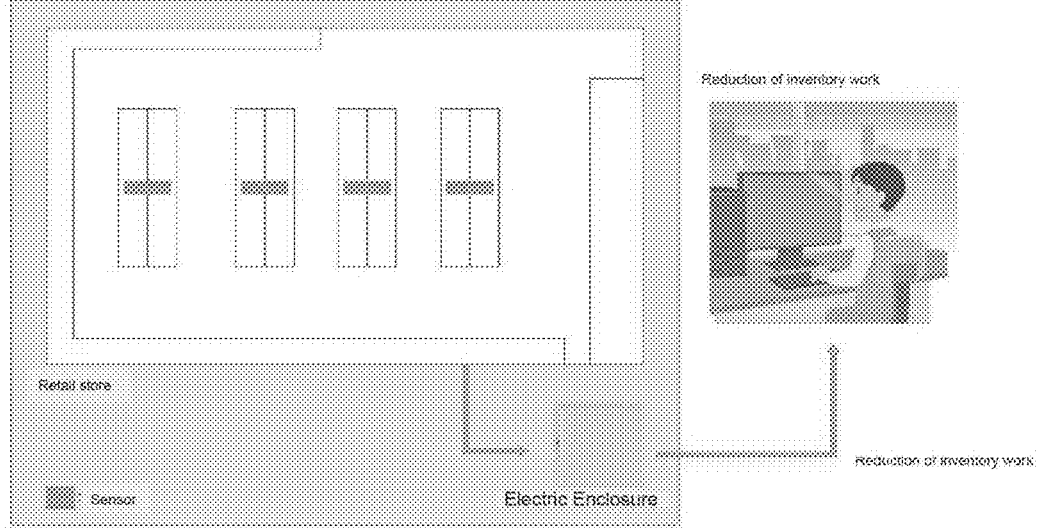

FIG. 10A is a diagram showing an example of applying the monitoring system of the present embodiment to a corrosion monitoring system. FIG. 10B is a diagram showing an example of applying the monitoring system of the present embodiment to an inventory monitoring system.

Figure 11A:
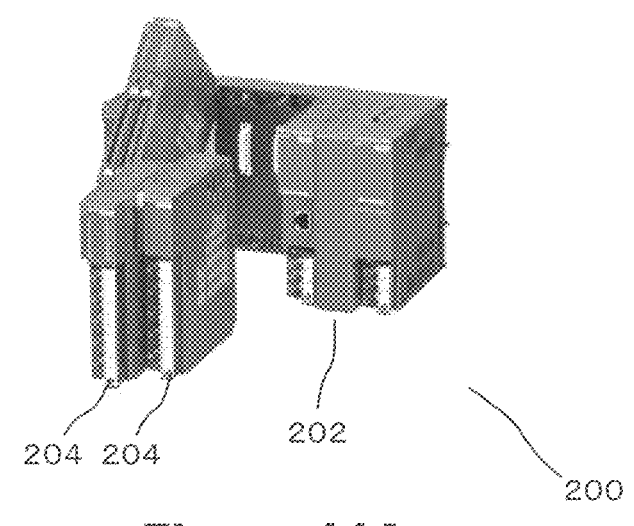
Figure 11B:
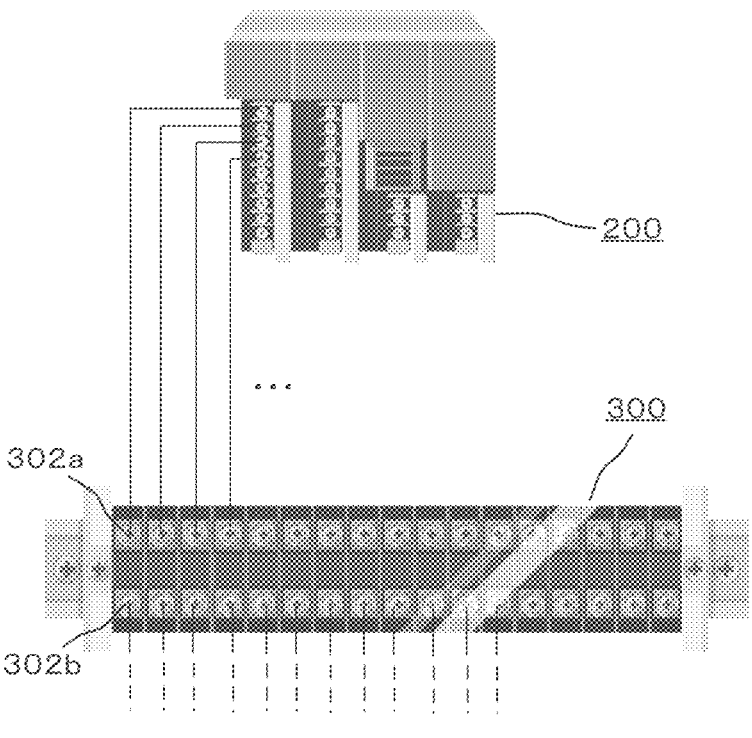

FIG. 11A is a diagram (a picture) showing an appearance shape of a conventional signal input/output apparatus 200. FIG. 11B is a diagram schematically showing a state in which contact terminals of the terminal units 204 of the conventional signal input/output apparatus 200 and contact terminals of a terminal block 300 are electrically connected, respectively, by physical signal lines.

Figure 12A:
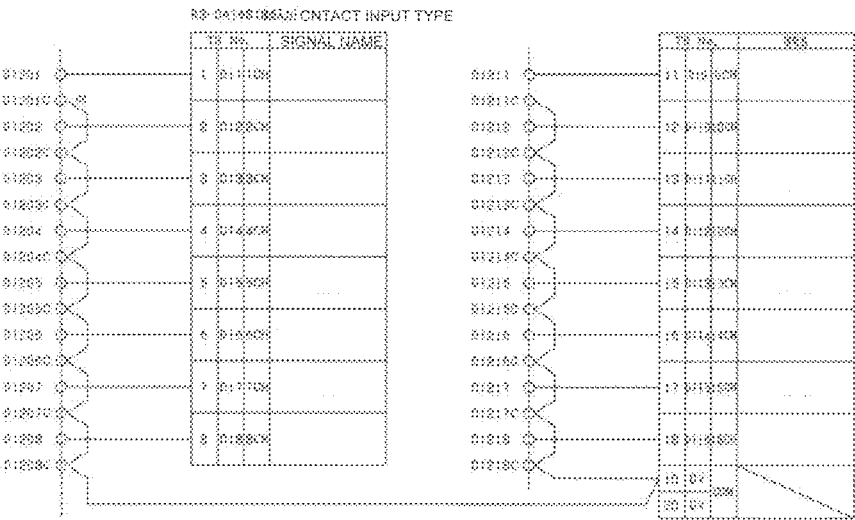
Figure 12B:
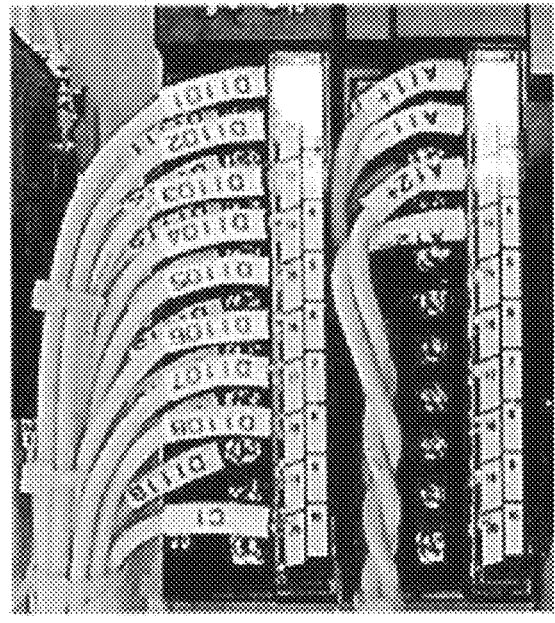

FIG. 12A is a diagram showing an example of an electrical wiring diagram in an electric enclosure. FIG. 12B is a picture showing a terminal block where a label is attached to each of signal lines connected to terminals.

DESCRIPTION OF EMBODIMENTS

Embodiments of the present invention will be described below with reference to drawings. Any of the embodiments below, however, does not give limited interpretation in recognition of the spirit of the present invention. The same or the same kind of members will be given the same reference sign, and description thereof may be omitted.

First Embodiment

Figure 1A:
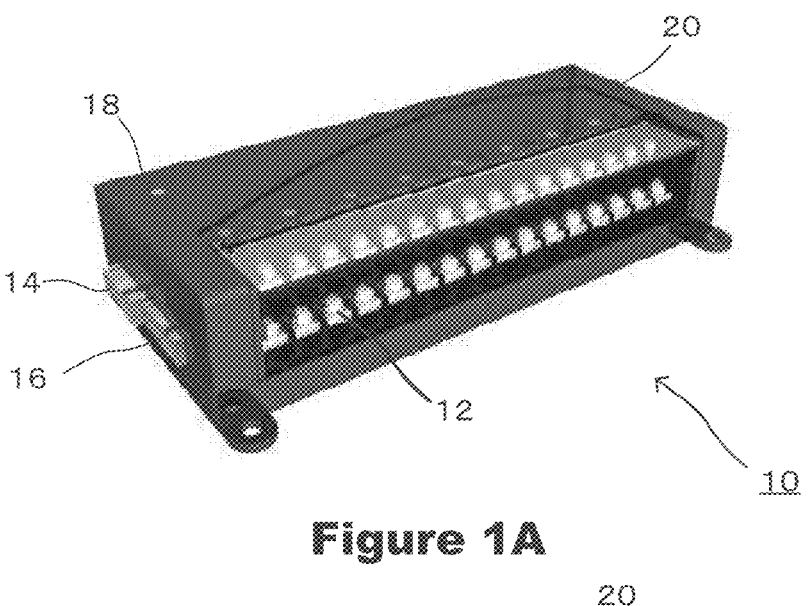
FIGS. 1A to 1C are diagrams showing an appearance shape of a casing of a terminal block unit.
Figure 1B:
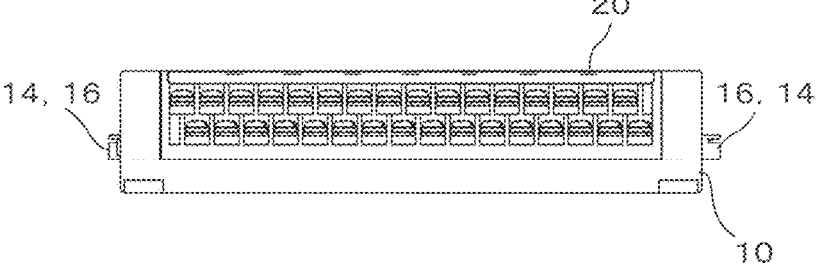
Figure 1C:
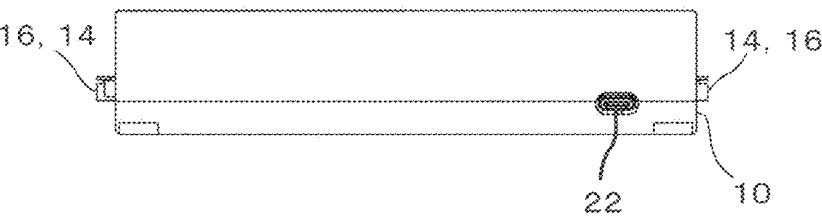

FIGS. 1A to 1C are diagrams showing an appearance shape of a casing of a terminal block unit. FIGS. 1A, 1B, and 1C show a perspective view, a front view, and a rear view, respectively.

The terminal block unit 10 has a plurality of contact terminals 12 on the front. On the left and right side faces of the casing, common connectors 14 and 16 are provided. On the upper face side, an electrification lamp 18 showing being electrified and a plurality of indicators 20 showing states of the terminals are provided. The number of contact terminals differs according to design. The example of FIG. 1 is a type with sixteen contact terminals.

Though there are a plurality of types of terminal block units depending on functions thereof, casings of all the types can be common to have the same appearance shape. Therefore, manufacturing costs are lowered, and, when terminal block units having a plurality of functions are combined and used, simple and unified design is realized as a whole. For example, the casing can be configured, with a size of 150 mm in width (not including a connector portion), 60 mm in depth, and 32 mm in height.

As shown in FIG. 1C, a USB-C connector is provided on the back face of the casing. The transmission speed of USB-C is faster than the speeds of other conventional USB standards, and is superior in the power supply control function. Therefore, it can be used for a power source of the terminal block unit 10. However, USB-C is an example, and other bus connectors are not excluded. This bus connector 22 can be used to be connected to a higher host apparatus via a predetermined cable.

Here, the plurality of types of terminal block units 10 will be described. The following is a list showing the types of the terminal block units 10.

Types of Terminal Block Units (I) Type X: 16-point contact signal measurement type (II) Type Y: 8-point analog signal measurement type (III) Type Z: 16-point contact signal output type Type X has a function of receiving input of a digital signal (a contact signal) at each of sixteen points, sixteen being is the number of contacts. Type Y has a function of receiving eight analog signals (currents or voltages). Type Z has a function of outputting a control signal (a contact signal) at each of sixteen points, sixteen being the number of contacts.

I. Contact Input Type (Type X)

Type X includes a control circuit for, in response to a non-voltage contact output of a sensor connected lower for a host apparatus connected higher, lighting up an indicator corresponding to an input state, and transmitting an input value as digitized data by communication via the bus, according to control from the measurement device. This is a configuration that is applied to a terminal block unit of a type of inputting an output signal from a sensor as a digital signal (Type X).

"Type X" that accepts a digital input signal is provided, for example, with a 32-bit MCU as a control circuit, and can receive digital signals of sixteen channels. There is no conduction among the channels, and one common terminal is provided. An input signal of the control circuit is a non-voltage contact input as described above, and a digital input circuit with an internal power supply of 3.75 V and 3 mA, an ON-current of 0.3 mA or above and an OFF-current of 0.3 mA or below as threshold currents, an ON-voltage of 3 V or below and an OFF-voltage of 4 V or above as threshold voltages, and an input cycle of 10 msec is used.

II. Analog Input Type (Type Y)

Type Y may be configured to include a function of receiving an output value of the sensor as an analog value of a current or voltage, for a host apparatus connected higher to light up an indicator of color or illuminance corresponding to the received input value, and a control circuit for converting the input value to digitized data according to control from the host apparatus to transmit the data to the host apparatus by communication via the bus. This is a configuration applied to a terminal block unit of a type of inputting an output from a sensor as an analog signal (Type Y).

"Type Y" that accepts an analog input signal is provided with a 32-bit MCU as a control circuit and an 8-channel A/D converter is provided. As for input of an analog value, 4-20 mA currents or 1-5 V voltages are possible. In Type Y for analog input, it is possible not only to express presence/absence of a signal by blinking but also to express the magnitude of the signal by color or brightness on the indicator 20 corresponding to each terminal.

FIG. 4 is a diagram showing change in color of the indicator 20. In this example, the indicator 20 is configured so that the color becomes bluer as the current or voltage becomes closer to the lower limit (4 mA/1 V), becomes redder changing from purple as the current or voltage value increases, becomes red or orange in the middle, becomes yellower as the current or voltage becomes closer to the upper limit (20 mA/5 V), and becomes white at the maximum. The indicator 20 may be configured so that not the color but the brightness (illuminance) changes according to the magnitude of the current or voltage.

In the case of a photovoltaic power generation system, Type Y can be used for the purpose of acquiring a value of a sensor (a measurement device) that outputs an analog value, for example, a pyranometer or a thermometer. By performing display together with a digital value acquired by Type X, such as an amount of photovoltaic power generation, it is possible to monitor whether a value of power generation is reasonable for solar radiation or not.

Since values of solar radiation and temperature are also important in the field of agriculture, Type Y is usable not only for photovoltaic power generation systems but also in other industrial fields. In addition, other typical sensors that acquire data as analog values include: a hygrometer, a water-temperature gauge, a water level meter, a wind vane, a compass, a gyro sensor, a strain gauge, a distance sensor, a barometer, a pressure sensor, an illuminometer, a rain sensor, a rain gauge, a tensiometer, an anemometer, a gas concentration meter, a vibroscope, and an accelerometer but are not limited thereto.

III. Contact Output Type (Type Z)

Type Z may be configured to include a control circuit for performing open-drain non-voltage contact output to the apparatus to be controlled, and lighting up an indicator according to a state of the contact output, by control from a host apparatus connected higher through communication via the bus. This is a configuration applied to a terminal block unit of a type of outputting a control signal from a host apparatus to an apparatus to be controlled (Type Z).

In the case of "Type Z" that outputs a digital signal, for example, a 32-bit MCU is provided as a control circuit, and digital signals of sixteen channels can be transmitted. There is no conduction among the channels, and one common terminal is provided. An output signal of the control circuit is an open-drain output (maximum DC of 30 V; total of 1.3 W; maximum output rating of, for example, 0.005 A or below at 24 V, 0.1 A or below at 12 V, and 0.26 A or below at 5 V), and a digital output circuit with an on-resistance of 20 mΩ or below is used. In this example, up to thirty-two units can be connected.

For example, it is possible to perform on/off control of a power generation control apparatus (a PCS) used in a photovoltaic power generation system by a Type-Z terminal block unit 10. In a photovoltaic power generation system, "power control rules" for controlling generated power according to an instruction by a power company exist. Therefore, the Type-Z terminal block unit 10 can be used as an apparatus for remotely controlling the PCS.

Of course, it is possible to control any apparatus that can be controlled by a contact signal. A different type of terminal block unit may be developed.

Second Embodiment

Both of FIGS. 2A and 2B show a state in which a plurality of terminal block units are connected. At the time of connecting terminal block units, different types of terminal block units can be connected by a connection unit C. In the drawings, Type-means "type". As shown in the drawings, connection to a higher host apparatus can be performed using an appropriate bus cable 24.

The number of connections, types of connected apparatuses, and order of connection are not restricted, and the apparatuses can be freely connected. When the apparatuses cannot be connected side by side due to constraints of the space in a switchboard, connectors of adjacent apparatuses (the connectors 14 and 16 in FIG. 1) may be connected by a connector connecting cable 26. The maximum number of connections is determined by the number of bits of an MCU, or the like. In the case of a 32-bit MCU, up to thirty-two apparatuses can be connected. In the case of digital input/output, up to 16 channels×32 apparatuses can be connected. In the case of analog input, up to 8 channels×32 apparatuses can be connected.

Both of FIGS. 3A and 3B show a state in which a host apparatus is connected to the other end of the bus cable 24 that is connected to a terminal block unit. FIG. 3A shows a state in which the bus cable 24 is connected to a measurement terminal 28, and, beyond the measurement terminal 28, a computer 30 or a smartphone 32 is connected. The smartphone and the measurement terminal are connected via a wireless communication standard such as wireless LAN or Bluetooth (registered trademark).

The measurement terminal is a small-sized terminal that is specialized in a function of mainly performing recording of data at a place near a measurement base, like the inside of an electric enclosure, and it is common to perform processing of acquired data in a computer or the like connected higher. However, the bus cable 24 can be connected not to the measurement terminal but directly to the computer 30 as shown in FIG. 3B. In this case, not only data processing but all processing including recording of data is performed on the computer side.

FIG. 5A shows an example of configuring a conventional 64-point measurement switchboard (FIG. 5B) configured with the signal input/output apparatus 200 and the terminal block 300 described with reference to FIG. 11, with the terminal block unit 10 shown in the present embodiment without changing the number of measurement points. Four terminal block units 10 of Type X (16-point digital inputs) are connected. Since each terminal block unit 10 is provided with only a function required for digital measurement, among functions of the signal input/output apparatus 200 (a data logger), the signal input/output apparatus 200 is unnecessary. Further, since each terminal block unit 10 also has a function of connecting signal lines from sensor apparatuses, as a terminal block, the terminal block units 10 are in a simple and compact configuration as a whole and can be stored in an electric enclosure smaller than a conventional one.

FIG. 6 is a diagram showing a system diagram screen applied to remote monitoring of a photovoltaic power generation system configured with a contact input (Type X) terminal block unit. The system diagram screen is configured to acquire states of a relay and a breaker, which are components for protecting an electrical circuit, and collectively display a state of the electrical circuits. On the electrical circuit, the relay has a role of detecting an overload/overcurrent/overvoltage or the like and breaking the circuit by the breaker. By collectively monitoring these, it is possible to easily grasp the state of the electrical circuit at a glance even if the number of contacts is huge. It is just like monitoring train operation.

It is thought that monitoring of an electrical circuit is in demand not only for photovoltaic power generation systems but also in a wide range of fields. Therefore, from the point of view of monitoring a state of an electrical circuit or a whole system using a sensor, it is also possible to apply a monitoring system configured using a terminal block unit of the present embodiment to technical fields other than the photovoltaic power generation system field.

Third Embodiment

FIG. 7 is a conceptual diagram showing an example of, by arranging a set of measurement equipment provided with a measurement or monitoring/control system constructed using a terminal block unit of the present invention in various places, constructing a system in which necessary data is transmitted to a cloud data management server from each base to enable data viewing from a remote place. Since data collected by many sensors is collected to a higher calculator as described above, it is easy to transmit the data to the cloud data management server through a telecommunications line such as the Internet.

Fourth Embodiment Application Examples

Application Example 1 (Monitoring System in Vinyl House)

FIG. 8 is a diagram showing an example of applying the monitoring system of the present embodiment to a monitoring system in a vinyl house. An example is shown in which, by arranging a pyranometer, thermometers (four), a $CO_2$ concentration meter, soil moisture meters (four), and EC meters (three) and connecting two analog-input terminal block units (Type Y), a monitoring system for measuring analog data at thirteen points and causing a monitoring screen in a remote place to perform display through a measurement terminal is configured.

Application Example 2 (Central Monitoring of Building)

FIG. 9A is a diagram showing an example of applying the monitoring system of the present embodiment to a central monitoring system in a building. For example, a central monitoring system for a building is constructed with three terminal block units of the analog input type (Type Y) and seven terminal block units of the contact input type (Type Z). In this example, 64 contact monitoring points (40 points for breakers, 10 points for security, 14 points for door opening/closing), 16 analog monitoring points (8 points for CT power consumption, 8 points for room temperature monitoring) are to be monitored for measurement for the first floor; and 32 contact monitoring points (20 points for breakers, 10 points for security, 2 points for door opening/closing), 8 analog monitoring points (4 points for CT power consumption, 4 points for room temperature monitoring)) are to be monitored for measurement for the second floor.

Application Example 3 (Congestion Situation Monitoring System for Restroom)

FIG. 9B is a diagram showing an example of applying the monitoring system of the present embodiment to a restroom use situation monitoring system. By arranging human sensors in a restroom, a use situation can be visualized.

Application Example 4 (Corrosion Monitoring System)

FIG. 10A is a diagram showing an example of applying the monitoring system of the present embodiment to a corrosion monitoring system. It has been performed to mount implantable sensors in a structure such as a bridge. It is possible to, by collecting data of the sensor for each base, perform maintenance on infrastructure before deterioration of buildings progresses.

Application Example 5 (Optimization of Store Inventory)

FIG. 10B is a diagram showing an example of applying the monitoring system of the present embodiment to an inventory monitoring system. If sensors are arranged on product shelves in a store to continuously monitor product inventory, it will lead to reduction of inventory work.

REFERENCE SIGNS LIST

10 Terminal block unit
12 Contact terminal
14 Connector
16 Connector
18 Electrification lamp
20 Indicator
22 Bus connector
24 Bus cable
26 Connector connecting cable
28 Measurement terminal
30 Computer
32 Smartphone

The invention claimed is:

1. A terminal block unit to be a minimum unit for constructing a measurement system using a sensor, or a control system for an apparatus to be monitored and/or controlled, using the measurement system, wherein the terminal block unit is used, intervening between the sensor or the apparatus to be controlled, which is connected lower than the terminal block unit, and a host apparatus connected higher than the terminal block unit;

the terminal block unit comprises a plurality of contact terminals and is electrically connected to the sensor or the apparatus to be controlled, through any of the plurality of contact terminals;

the terminal block unit comprises a microcontroller unit (MCU);

the terminal block unit is configured so that direct connection is possible between the terminal block unit and another terminal block unit and between the terminal block unit and the host apparatus through a common serial bus; and the common serial bus is configured to supply both communication signals and electric power to each of the terminal block units, thereby enabling electronic and physical direct connection and expansion of the number of terminals.

2. The terminal block unit according to claim 1, wherein the terminal block unit and the other terminal block unit are configured so that power is supplied from the common serial bus.

3. The terminal block unit according to claim 1, wherein the terminal block unit comprises a plurality of indicators corresponding to the plurality of contact terminals, respectively.

4. The terminal block unit according to claim 1, comprising a connector directly connectable to the other terminal block unit not via wiring.

5. The terminal block unit according to claim 1, comprising a control circuit for, in response to a non-voltage contact output of the sensor connected lower for the host apparatus connected higher, lighting up an indicator corresponding to an input state, and transmitting an input value as digitized data by communication via the common serial bus, according to control from a measurement device.

6. The terminal block unit according to claim 1, having a function of receiving an output value of the sensor as an analog value of a current or voltage, for the host apparatus connected higher to light up an indicator of color or illuminance corresponding to a received input value, and a control circuit for converting the received input value to digitized data according to control from the host apparatus to transmit the digitized data to the host apparatus by communication via the common serial bus.

7. The terminal block unit according to claim 1, comprising a control circuit for performing open-drain non-voltage contact output to the apparatus to be controlled, and lighting up an indicator according to a state of the open-drain non-voltage contact output, by control from the host apparatus connected higher through communication via the common serial bus.

8. An electric enclosure connecting one or more connected terminal block units and the host apparatus, each of the one or more connected terminal block units and the host apparatus being the terminal block unit and the host apparatus according to claim 5, wherein the host apparatus is a measurement terminal, the measurement terminal having a function of recording data outputted from the terminal block unit or the one or more connected terminal block units.

9. A monitoring system for acquiring states of an electrical circuit provided at a remote place, by the sensor, and collectively displaying the states of the electrical circuit, wherein the sensor, the terminal block unit and the host apparatus according to claim 5 are installed in a monitoring target area; and data collected to the host apparatus is received via a telecommunications line.

* * * * *